(12) United States Patent
Koh

(10) Patent No.: US 7,424,087 B2
(45) Date of Patent: Sep. 9, 2008

(54) CLOCK DIVIDER

(75) Inventor: Kyoung-Min Koh, Suwon-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 86 days.

(21) Appl. No.: 11/609,411

(22) Filed: Dec. 12, 2006

(65) Prior Publication Data
US 2007/0152720 A1  Jul. 5, 2007

(30) Foreign Application Priority Data
Jan. 5, 2006  (KR) .................. 10-2006-0001279

(51) Int. Cl.
*H03K 21/00* (2006.01)
*H03K 23/00* (2006.01)
(52) U.S. Cl. .................. 377/47; 377/48; 327/115
(58) Field of Classification Search .............. 327/115, 327/117; 377/47, 48
See application file for complete search history.

(56) References Cited
U.S. PATENT DOCUMENTS
6,385,276 B1 * 5/2002 Hunt et al. ............ 377/47
6,404,839 B1 * 6/2002 Fong et al. ............ 377/47
6,424,192 B1 7/2002 Lee et al.
6,822,491 B1 * 11/2004 Glass .................. 327/115
7,233,181 B2 * 6/2007 Osako ................. 327/115
7,248,665 B2 * 7/2007 Shi et al. .............. 377/47

FOREIGN PATENT DOCUMENTS
JP   07-321613    12/1995
JP   2003-174359   6/2003
KR   20-0164990   10/1999

* cited by examiner

*Primary Examiner*—Tuan T Lam
(74) *Attorney, Agent, or Firm*—F. Chau & Associates, LLC.

(57) ABSTRACT

A clock divider includes a first state storage unit, a second state storage unit a first control signal generating unit a state update unit and an output unit. The first state storage unit receives an update signal to perform transition of a first state value in synchronization with a clock signal. The second state storage unit performs transition of a second state value in synchronization with a first state signal corresponding to the first state value. The first control signal generating unit generates a first control signal for determining a first state transition path based on a first division ratio control signal. The state update unit generates the update signal based on the first control signal and the first state signal. The output unit selectively output the first state signal or a second state signal corresponding to the second state value.

23 Claims, 12 Drawing Sheets

| PRESENT STATE | NEXT STATE |
|---|---|
| $Q_1$ $Q_2$ A | $Q_1$ $Q_2$ |
| 0  0  X | 0  1 |
| 0  1  0 | 0  0 |
| 0  1  1 | 1  1 |
| 1  1  X | 0  0 |
| 1  0  X | 0  0 |

| DIVISION RATIO CONTROL SIGNAL $C_1$ $C_0$ | S0 0 | 1 |
|---|---|---|
| 0 0 | /2 | /4 |
| 0 1 | X | /5 |
| 1 X | /3 | /6 |

DIVISION RATIO=1/7

DIVISION RATIO=1/9

DIVISION RATIO=1/11

DIVISION RATIO=1/7

DIVISION RATIO=1/9

DIVISION RATIO=1/11

MULTI FUNCTION

FIG. 3C

| PRESENT STATE | | | | NEXT STATE | |
|---|---|---|---|---|---|
| $Q_1$ | $Q_2$ | A | B | $Q_1$ | $Q_2$ |
| 0 | 0 | X | 0 | 0 | 0 |
| 0 | 0 | X | 1 | 0 | 1 |
| 0 | 1 | 0 | X | 0 | 0 |
| 0 | 1 | 1 | X | 1 | 1 |
| 1 | 1 | X | X | 0 | 0 |
| 1 | 0 | X | X | 0 | 0 |

| CONTROL BIT | | $D_1 D_0(S_0=0)$ | $D_1 D_0(S_0=1)$ | | | |
|:-:|:-:|:-:|:-:|:-:|:-:|:-:|
| $C_1$ | $C_0$ | 00 | 00 | 01 | 11 | 10 |
| 0 | 0 | /2 | /4 | /6 | /8 | /10 |
| 0 | 1 | X | /5 | /7 | /9 | /11 |
| 1 | X | /3 | /6 | /8 | /10 | /12 |

| PRESENT STATE | | | | NEXT STATE | |
|---|---|---|---|---|---|
| $Q_1$ | $Q_2$ | A | B | $Q_1$ | $Q_2$ |
| 0 | 0 | X | 0 | 0 | 0 |
| 0 | 0 | X | 1 | 0 | 1 |
| 0 | 1 | 0 | X | 0 | 0 |
| 0 | 1 | 1 | X | 1 | 1 |
| 1 | 1 | X | X | DC | 0 |
| 1 | 0 | X | X | 0 | 0 |

CLOCK DIVIDER

CROSS-REFERENCE TO RELATED PATENT APPLICATION

This application claims priority to Korean Patent Application No. 2006-0001279, filed on Jan. 5, 2006, the contents of which are herein incorporated by reference in their entirety.

BACKGROUND OF THE INVENTION

1. Technical Field

The present disclosure relates to a clock divider and, more particularly to a clock divider capable of producing different output signals based on various division ratios.

2. Discussion of Related Art

Generally, a clock divider is used in a phase locked loop (PLL) circuit or a clock generating circuit. A clock generating circuit may be formed as a separate integrated circuit (chip) or formed as part of a larger chip to provide clock signals internally or externally. A clock divider used in a PLL may generate different clock signals of various division ratios. Conventional clock dividers include a plurality of clock dividers having predetermined division ratios and a multiplexer for selecting and outputting a divided clock signal generated by one of the clock dividers.

In the conventional clock dividers that include a plurality of clock dividers having various division ratios, the chip size is increased in proportion to the number of clock division ratios and the power consumption is increased. In addition, a glitch may occur when a division ratio of an output signal is changed in the conventional clock divider. An additional circuit such as a glitch filter may be necessary for preventing the glitch, which further increases the chip size and power consumption.

SUMMARY OF THE INVENTION

Exemplary embodiments of the present invention generally provide a clock divider capable of producing different clocks of various division ratios.

Exemplary embodiments of the present invention generally provide a clock divider capable of producing different clocks of various division ratios at a duty ratio of 50:50.

According to an exemplary embodiment of the present invention, a clock divider includes a first state storage unit, a second state storage unit, a first control signal generating unit, a state update unit and an output unit. The first state storage unit receives an update signal to perform transition of a first state value in synchronization with a clock signal. The second state storage unit performs transition of a second state value in synchronization with a first state signal corresponding to the first state value. The first control signal generating unit generates a first control signal for determining a first state transition path based on a first division ratio control signal. The state update unit generates the update signal based on the first control signal and the first state signal. The output unit selectively outputs the first state signal or a second state signal corresponding to the second state value.

The first state storage unit may include two D flip-flops, and the second state storage unit may include one D flip-flop. The D flip-flop of the second state storage unit may include an inverting output terminal and an input terminal electrically coupled to each other.

The clock divider may further include a second control signal generating unit configured to generate a second control signal for determining a second state transition path based on a second division ratio control signal.

The state update unit may generate the update signal based on the first control signal, the first state signal and the second control signal.

The state update unit may generate a counting enable signal based on the first state signal, and the second control signal generating unit includes a counter configured to count in synchronization with the clock signal when the counting enable signal is enabled, and a second control signal generating circuit configured to generate the second control signal based on an output signal of the counter and the second division ratio control signal. The counter may be a gray counter.

According to an exemplary embodiment of the present invention, a clock divider includes a clock-phase determining unit, a first state storage unit, a second state storage unit, a control signal generating unit, a state update unit and an output unit. The clock-phase determining unit determines a phase of a clock signal based on a clock control signal. The first state storage unit receives an update signal to perform transition of a first state value in synchronization with the clock signal. The second state storage unit performs transition of a second state value in synchronization with a first state signal determined by the first state value. The control signal generating unit generates a control signal for determining a state transition path based on a division ratio control signal. The state update unit generates the update signal based on the control signal, the first state signal and the clock control signal. The output unit selectively outputs the first state signal or a second state signal corresponding to the second state value. An output signal of the output unit may have a duty ratio of 50:50.

The first state storage unit may include two D flip-flops and the second state storage unit may include one D flip-flop. The D flip-flop of the second state storage unit may include an inverting output terminal and an input terminal electrically coupled to each other.

The state update unit may generate a counting enable signal based on the first state signal, and the control signal generating unit includes a counter configured to count in synchronization with the clock signal when the counting enable signal is enabled, and a control signal generating circuit configured to generate the control signal based on an output signal of the counter and the division ratio control signal. The counter may be a gray counter.

According to an exemplary embodiment of the present invention, a clock divider includes a clock-phase determining unit, first and second D flip-flops, a third D flip-flop, a control signal generating unit, a state update unit and an output unit. The clock-phase determining unit determines a phase of a clock signal based on a clock control signal. The first and second D flip-flops receive the clock signal through clock terminals respectively. The third D flip-flop receives an output signal of the second D flip-flop through a clock terminal and an input terminal and an inverting output terminal of the third D flip-flop are electrically coupled to each other. The control signal generating unit generates a control signal for determining a state transition path based on a division ratio control signal. The state update unit generates first and second update signals based on the control signal and output signals of the first and second D flip-flops, provides the first update signal to an input terminal of the first D flip-flop, and provides the second update signal to an input terminal of the second D flip-flop. The output unit selectively outputs an output signal of the second D flip-flop or an output signal of the third D flip-flop. An output signal of the output unit has a duty ratio of 50:50.

The clock-phase determining unit may determine a phase of the clock signal based on the clock control signal and an output signal of the first D flip-flop. The state update unit generates a counting enable signal based on the output signals of the first and second D flip-flops, and the control signal generating unit may include a counter configured to count in synchronization with the clock signal when the counting enable signal is enable, and a control signal generating circuit configured to generate the control signal based on an output signal of the counter and the division ratio control signal. The counter may be a gray counter.

According to an exemplary embodiment of the present invention, a clock divider includes a clock-phase determining unit, a state machine, a control signal generating unit, a second output signal generating unit and an output unit. The clock-phase determining unit determines a phase of a clock signal based on a clock control signal. The state machine stores a state value transitioning in synchronization with the clock signal and provides a first output signal determined by the state value. The control signal generating unit provides a first control signal and a second control signal for controlling a transition path of the state value. The second output signal generating unit generates a second output signal reiterating a rising and a falling in synchronization with an active edge of the first output signal. The output unit selectively outputs the first output signal or the second output signal based on an output control signal.

For example, the state value corresponding to 00 maintains 00 when the second control signal is not activated, and transitions to 01 in synchronization with a non-inverting clock signal when the second control signal is activated. The state value corresponding to 01 transitions to 00 in synchronization with the non-inverting clock signal when the first control signal is not activated, and transitions to 11 in synchronization with the non-inverting clock signal when the first control signal is activated. The state value corresponding to 11 or 10 transitions to 00 in synchronization with the non-inverting clock signal. The output unit provides the first output signal.

The control signal generating unit may include a counter configured to count a number of clocks while the second control signal is not activated.

For example, the state value corresponding to 00, the state value maintains 00 when the second control signal is not activated, and transitions to 01 in synchronization with a non-inverting clock signal when the second control signal is activated. The state value corresponding to 01 transitions to 00 in synchronization with the non-inverting clock signal when the first control signal is not activated, and transitions to 11 in synchronization with the non-inverting clock signal when the first control signal is activated. The state value corresponding to 11 transitions to 10 in synchronization with the non-inverting clock signal, and the state value corresponding to 10 transitions to 0 in synchronization with the non-inverting clock signal. The output unit provides the first output signal.

The control signal generating unit may include a counter configured to count a number of clocks while the second control signal is not activated when the state value corresponds to 00.

BRIEF DESCRIPTION OF THE DRAWINGS

The present invention will become more apparent to those of ordinary skill in the art when descriptions of exemplary embodiments thereof are read with reference to the accompanying drawings.

FIG. 3C is a state transition table corresponding to the state diagram of FIG. 3B.

DESCRIPTION OF EXEMPLARY EMBODIMENTS

Figures 1A, 1B:
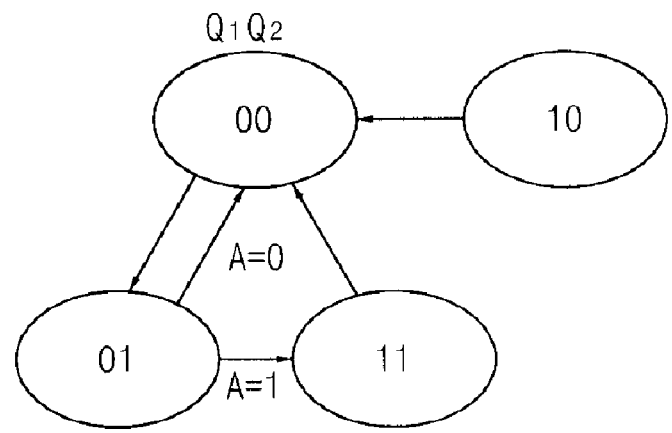
FIG. 1A is a state diagram illustrating operations of a clock divider according to an exemplary embodiment of the present invention.
FIG. 1B is a state transition table corresponding to the state diagram of FIG. 1A.

Hereinafter, exemplary embodiments of the present invention will be described in detail with reference to the accompanying drawings. Like reference numerals refer to similar or identical elements throughout the description of the figures.

FIG. 1A is a state diagram illustrating operations of a clock divider according to an exemplary embodiment of the present invention.

Referring to FIG. 1A, the state diagram illustrates operations of a state-transition when a clock divider provides a clock divided by five.

A state value may be represented as two-bit data Q1Q2 that corresponds to 00, 01, 11 or 10.

The state value Q1Q2 may transition in synchronization with a clock. For example, the state value Q1Q2 may transition in response to a rising edge or a falling edge of the clock with one clock cycle.

When the state value Q1Q2 corresponds to 00, the state value Q1Q2 may transition to 01 in synchronization with the clock.

When the state value Q1Q2 corresponds to 01, the state value Q1Q2 may transition to 00 or 11 according to a logic level of a control signal A. When the control signal A is not activated; such as for example, when A=0, the state value Q1Q2 transitions to 00 in synchronization with the clock. When the control signal A is activated, such as for example, when A=1 the state value Q1Q2 transitions to 11 in synchronization with the clock. However it is to be understood that a state diagram may be configured such that when A=1, the control signal A is not activated, and when A=0, the control signal A is activated.

When the state value Q1Q2 corresponds to 11 or 10, the state value Q1Q2 may transition to 00 in synchronization with the clock.

Transitions of the state value Q1Q2 as described above may be arranged as shown in the state transition table of FIG. 1B.

FIG. 1B is a state transition table corresponding to the state diagram of FIG. 1A.

When the present state value Q1Q2 corresponds to 00, the next state value Q1Q2 may be 01 regardless of the logic level of the control signal A.

When the present state value Q1Q2 corresponds to 01, the next state value Q1Q2 may be 00 when A=0, and a next state value Q1Q2 may be 11 when A=1.

When the present state value Q1Q2 corresponds to 11, the next state value Q1Q2 may be 00 regardless of the logic level of the control signal A.

When the present state value Q1Q2 corresponds to 10, the next state value Q1Q2 may be 00 regardless of the logic level of the control signal A.

When the control signal A corresponds to logic 0, Q2 of the state value Q1Q2 may reiterate "01" with two clock cycles. Thus, a clock divided by two may be produced by using Q2 as an output signal.

When the control signal A corresponds to logic 1, Q2 of the state value Q1Q2 may reiterate "011" with three clock cycles. Thus, a clock divided by three may be produced by using Q2 as an output signal.

When the control signal A alternates between logic 0 and logic 1, Q2 of the state value Q1Q2 may reiterate "01011" with five clock cycles. Thus, a clock divided by five may be produced by using Q2 as an output signal.

A clock divider including a state machine operating based on the transition of the state value as shown in FIG. 1A will be described with reference to FIG. 2A.

Figure 2A:
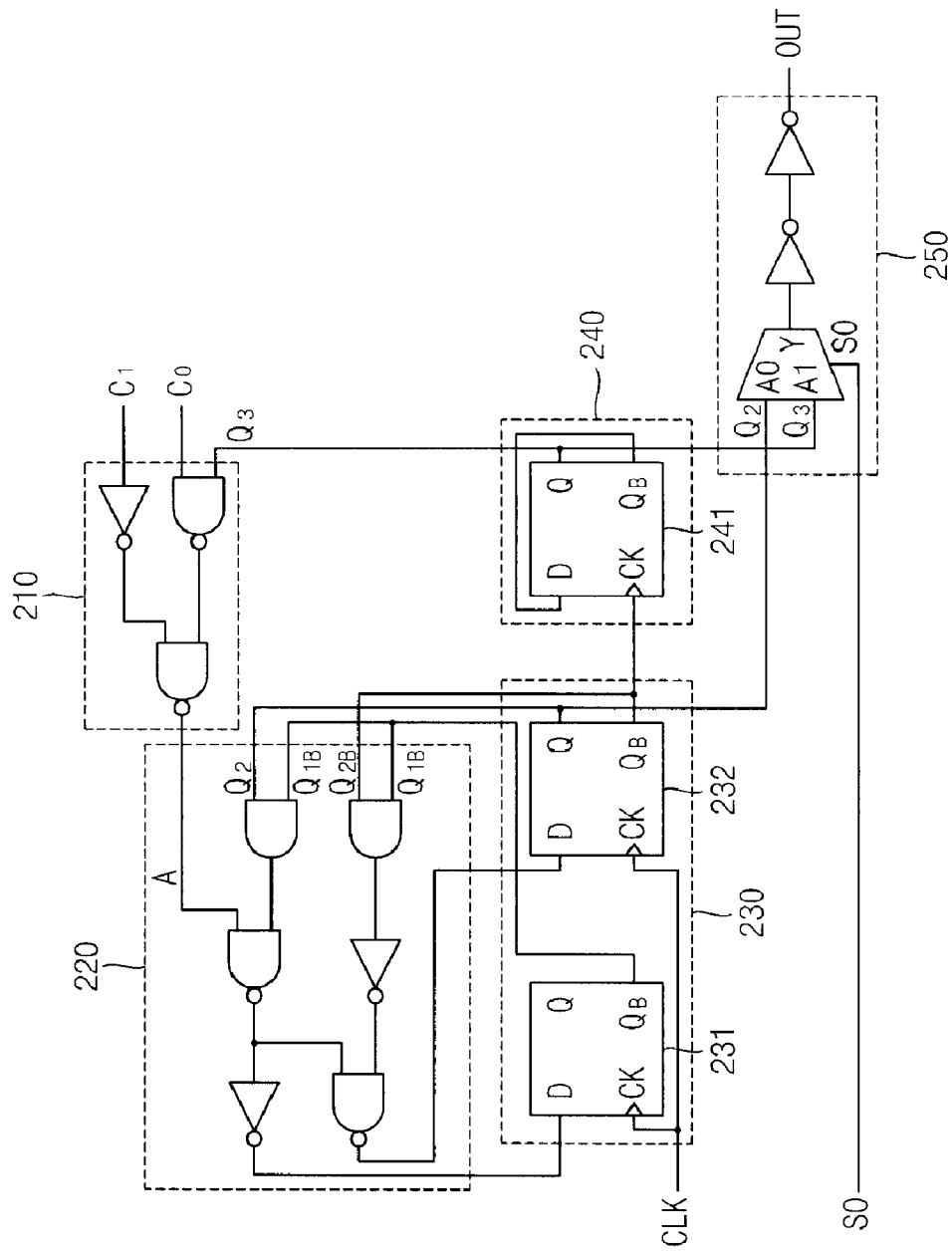
FIG. 2A is a circuit diagram illustrating a clock divider according to an exemplary embodiment of the present invention.

FIG. 2A is a circuit diagram illustrating a clock divider according to an exemplary embodiment of the present invention.

Referring to FIG. 2A, in the first and second D flip-flops 231 and 232, input signals may be referred to as D1 and D2, respectively, non-inverting output signals may be referred to as Q1 and Q2, respectively, and inverting output signals may be referred to as Q1B and Q2B, respectively. In a third D flip-flop 241, a non-inverting output signal and an inverting output signal may be referred to as Q3 and Q3B respectively.

A clock divider may include a first state storage unit 230, a second state storage unit 240, a control signal generating unit 210, a state update unit 220 and an output unit 250. The first state storage unit 230 and the state update unit 220 may correspond to the state machine described by the state diagram of FIG. 1A.

The control signal generating unit 210 may generate a control signal A for determining a state transition path based on a division ratio control signal C0C1.

The first state storage unit 230 may include the first and second D flip-flops 231 and 232 to store a first state value represented as two-bit data Q1Q2. For example, the first D flip-flop 231 may store Q1 of the first state value Q1Q2 and the second D flip-flop 232 may store Q2 of the first state value Q1Q2. Clock terminals of the first and second D flip-flops 231 and 232 may be provided with a clock CLK as shown in FIG. 2A.

The state update unit 220 may generate an update signal based on a first state signal determined by the state value of the first state storage unit 230. The update signal may include a first update signal and a second update signal, where the first update signal may be applied to an input terminal of the first D flip-flop 231, and the second update signal may be applied to an input terminal of the second D flip-flop 232.

The logic level of the first update signal and the second update signal may be determined by Equation 1

$$D1(\text{NEXT}) = Q1B \cdot Q2 \cdot A$$

$$D2(\text{NEXT}) = (Q1B \cdot Q2B) + (Q1B \cdot Q2 \cdot A),\quad \text{[Equation 1]}$$

where D1(NEXT) indicates the first update signal and D2(NEXT) indicates the second update signal.

When the first and second D flip-flops 231 and 232 are provided with the first and second update signals, respectively, the first state value Q1Q2 may transition to the next state value in synchronization with the clock CLK.

The first state signal including the updated output signal Q1B of the first D flip-flop 231 and the updated output signals Q2 and Q2B of the second D flip-flop 232 may be applied to the state update unit 220 to be used to generate the next update signal. The first state signal may be determined by the first state value Q1Q2 and include the output signals Q1, Q1B, Q2 and Q2B of the first and second D flip-flops 231 and 232. Similarly, a second state signal may be determined by a second state value and may include the output signals Q3 and Q3B of the third D flip-flop 241.

The second state storage unit 240 may include the third D flip-flop 241 to store the second state value. A clock terminal of the third D flip-flop 241 may be provided with the first state signal. In an exemplary embodiment of the present invention, the clock terminal of the third D flip-flop 241 receives the inverting output signal Q2B of the second D flip-flop 232. However, it is to be understood that the clock divider may be configured such that the clock terminal of the third D flip-flop 241 may be provided with the non-inverting output signal Q2 of the second D flip-flop 232.

In the third D flip-flop 241, an inverting output terminal may be electrically coupled with an input terminal. Thus, the output signal Q3 of the third D flip-flop 241 may be alternated between 0 and 1 in response to a rising edge or a falling edge of the inverting output signal Q2B of the second D flip-flop 232.

The output unit 250 may select either the non-inverting output signal Q2 of the second D flip-flop 232, which is included in the first state signal, or the non-inverting output signal Q3 of the third D flip-flop 241, which is included in the second state signal, based on an output control signal S0, to output the selected signal. However, it is to be understood that the output unit 250 may be configured to select either the inverting output signal Q2B of the second D flip-flop 232, which is included in the first state signal, or the inverting output signal Q3B of the third D flip-flop 241, which is included in the second state signal, to output the selected signal.

Figures 2B, 2C:
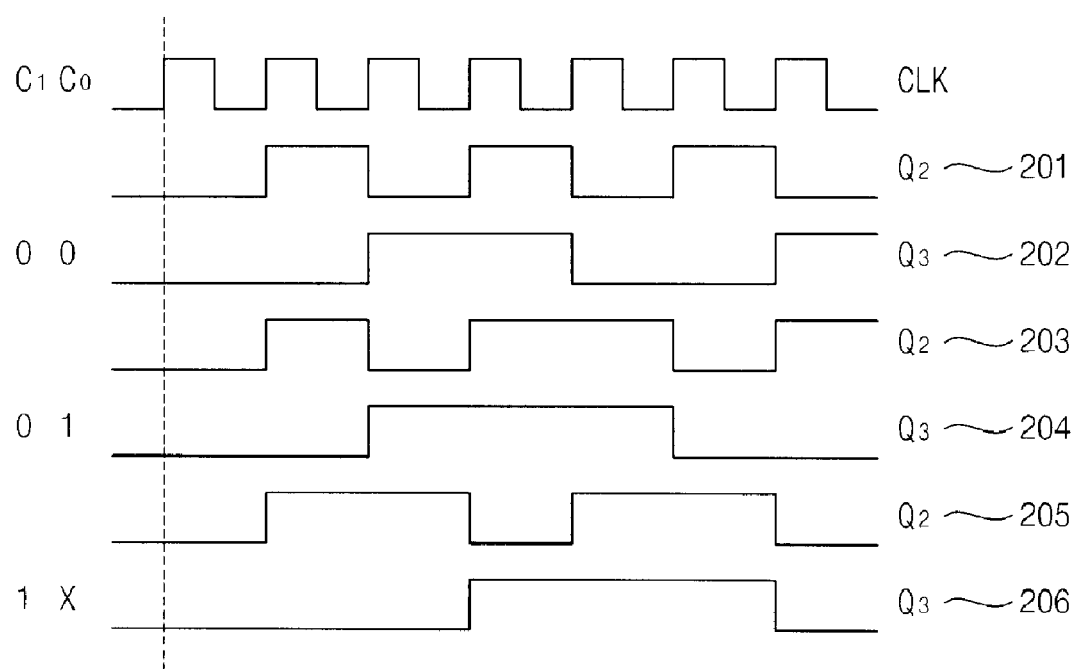
FIG. 2B is a table illustrating a change of a division ratio of the clock divider of FIG. 2A, according to a division ratio control signal.
FIG. 2C is a waveform diagram illustrating output signals of the clock divider of FIG. 2A, according to a division ratio control signal.

FIG. 2B is a table illustrating a change of a division ratio of the clock divider of FIG. 2A, according to a division ratio control signal. FIG. 20 is a waveform diagram illustrating output signals of the clock divider of FIG. 2A, according to a division ratio control signal.

Referring to FIG. 2B, a division ratio control signal C1C0 may include a first bit C1 and a second bit C0. When both of the first bit C1 and the second bit C0 correspond to 0, the control signal A may be 0. When the first bit C1 corresponds to 0 and the second bit C0 correspond to 1, the control signal A may reiterate 0 and 1. When the first bit C1 corresponds to 1, the control signal A may be 1. The clock divider may provide Q2 when the output control signal S0 corresponds to 0 and provide Q3 when the output control signal S0 corresponds to 1.

As shown in FIG. 2B, when both the first bit C1 and the second bit C0 correspond to 0 and the output control signal S0 corresponds to 0, Q2 may be provided as an output signal 201 and a division ratio may be 1/2. When both the first bit C1 and the second bit C0 correspond to 0 and the output control signal S0 corresponds to 1, Q3 may be provided as an output signal 202 and the division ratio may be 1/4.

When the first bit C1 corresponds to 0, the second bit C0 corresponds to 1 and the output control signal S0 corresponds to 1, Q3 may be provided as an output signal 204 and the division ratio may be 1/5. When the first bit C1 aft corresponds to 0, the second bit C0 corresponds to 1 and the output control signal S0 corresponds to 0, Q2 may be provided as an output signal 203, however, in this case, the division ratio may be 1/2.5, which is not suitable for a duty ratio of 1/2.

When the first bit C1 corresponds to 1 and the output control signal S0 corresponds to 0, Q2 may be provided as an output signal 205 and the division ratio may be 1/3. When the first bit C1 corresponds to 1 and the output control signal S0 corresponds to 1, Q3 may be provided as an output signal 206 and the division ratio may be 1/6.

Hereinafter, a clock divider capable of producing different clocks in various division ratios will be described with reference to FIG. 3A through FIG. 5.

Figure 3A:
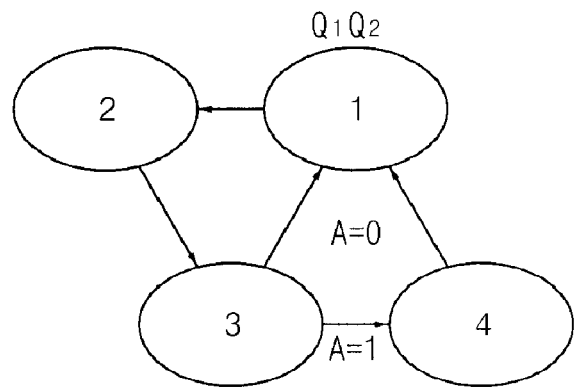
FIG. 3A is a state diagram illustrating operations of a clock divider according to an exemplary embodiment of the present invention.
Figure 3A:
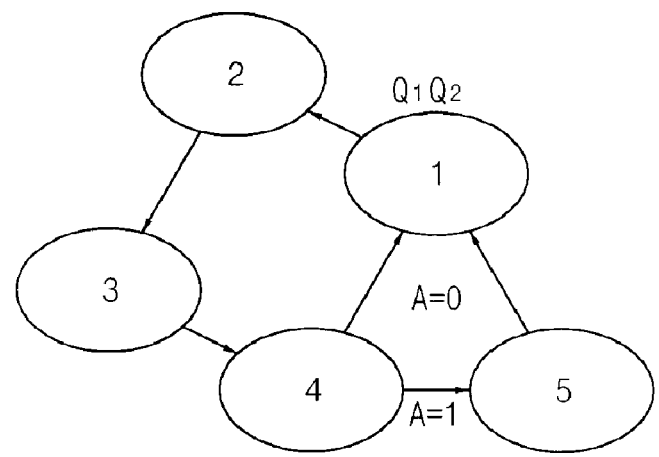
Figure 3A:
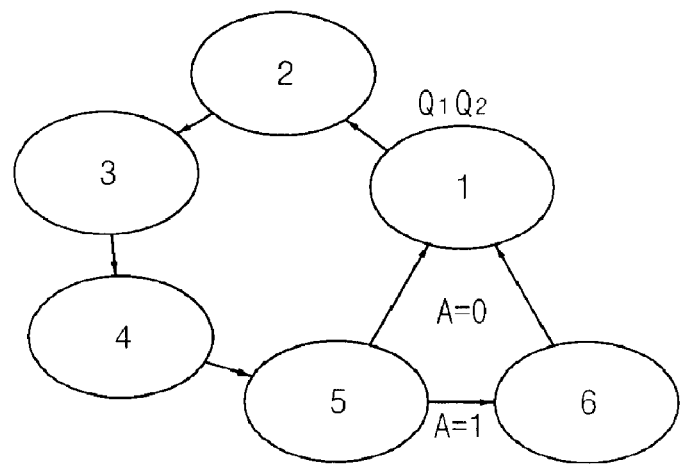

FIG. 3A is a state diagram illustrating operations of a clock divider according to an exemplary embodiment of the present invention.

Referring to FIG. 3A, the respective state diagrams illustrate operations of clock dividers capable of producing clocks down-divided by seven, by nine and by eleven respectively. A control signal A may reiterate logic 0 and logic 1.

For example, in the case of a clock divided by seven, a state value may reiterate "1, 2, 3, 1, 2, 3, 4" in synchronization with a clock. That is, a reiteration period may correspond to seven clock cycles.

In the case of a clock divided by nine, a state value may reiterate "1, 2, 3, 4, 1, 2, 3, 4, 5" in synchronization with a clock. That is, a reiteration period may correspond to nine clock cycles.

In the case of a clock divided by eleven, a state value may reiterate "1, 2, 3, 4, 5, 1, 2, 3, 4, 5, 6" in synchronization with a clock. That is, a reiteration period may correspond to eleven clock cycles.

Transitions of a state value represented as two-bit data will be described with reference to FIG. 3B.

Figure 3B:
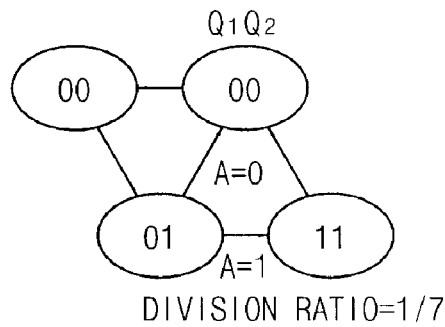
FIG. 3B is a state diagram illustrating operations of a clock divider based on a state value of two bits.
Figure 3B:
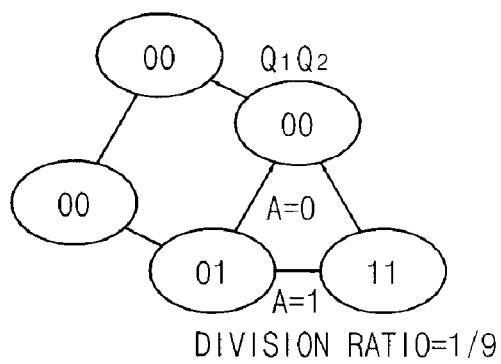
Figure 3B:
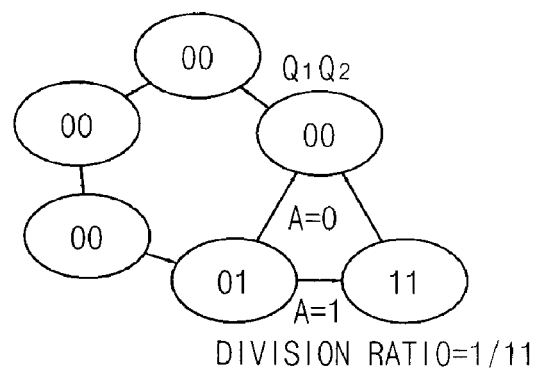
Figure 3B:
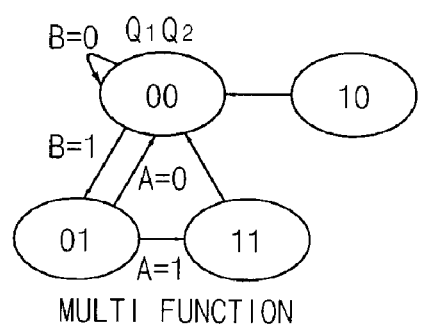

FIG. 3B is a state diagram illustrating operations of a clock divider based on a state value of two bits.

Referring to FIG. 3B, a state value may be represented as two-bit data Q1Q2 corresponding to 00, 01, 11 or 10.

The state value may transition in synchronization with a clock. For example, the state value may transition in response to a rising edge or a falling edge of the clock with one clock cycle.

A control signal may control a transition path of the state value and may include a first control signal A and a second control signal B.

When the state value Q1Q2 corresponds to 00, the state value Q1Q2 may maintain 00 or transition to 01 according to the second control signal B. When the second control signal B is not activated, for example, when B=0, the state value Q1O2 maintains 00 and the second control signal B is activated, for example when B=1, the state value Q1Q2 transitions to 01 in synchronization with the clock. However, it is to be understood that the state diagram may be configured such that when B=1, the second control signal B is not activated, and when B=0 the second control signal B is activated.

When the state value Q1Q2 corresponds to 01, the state value Q1Q2 may transition to 00 or 11 according to the logic level of the first control signal A. For example, when the first control signal A is not activated, for example, when A=0, the state value Q1Q2 may transition to 00 in synchronization with the clock In the case when the first control signal A is activated, for example, when A=1, the state value Q002 may transition to 11 in synchronization with the clock. However, it is to be understood that the state diagram may be configured such that when A=1, the first control signal A is not activated, and when A=0, the first control signal A is activated.

When the state value Q1Q2 corresponds to 11 or 10, the state value Q1O2 may transition to 00 in synchronization with the clock.

In an exemplary embodiment of the present invention, the division ratio may be changed according to a number of clocks, in which the second control signal B is not activated, when the state value Q1Q2 corresponds to 00. In the case that the number of clock cycles while the second control signal B is not activated is zero, the state diagram of FIG. 3B may be identical with the state diagram of FIG. 1A.

When the number of clock cycles in which the second control signal B is not activated is one and the state value Q1Q2 corresponds to 00, a clock divided by seven may be provided.

When the number of clocks in which the second control signal B is not activated is two and the state value Q1Q2 corresponds to 00, a clock divided by nine may be provided.

When the number of clocks in which the second control signal B is not activated is three and the state value Q1Q2 corresponds to 00, a clock divided by eleven may be provided.

In an exemplary embodiment of the present invention, when the number of clocks in which the second control signal B is not activated is n, where n is a positive integer and the state value Q1Q2 corresponds to 00, a clock divided by 2n+5 may be provided.

Transitions of the state value as described above may be arranged as shown in the state transition table of FIG. 3C.

FIG. 3C is a state transition table illustrating a transition of the state value of FIG. 3B.

When the present state value Q1Q2 corresponds to 00, the next state value Q1Q2 may be 00 in the case that the second control signal B is logic 0 and may be 01 in the case that the second control signal B is logic 1.

When the present state value Q1Q2 corresponds to 01, the next state value Q1Q2 may be 00 in the case that the first control signal A is logic 0, and may be 11 in the case that the first control signal A is logic 1.

When the present state value Q1Q2 corresponds to 11, the next state value Q1Q2 may be 00 regardless of the logic level of the first and second control signals A and B.

When the present state value Q102 corresponds to 10 the next state value Q1Q2 may be 00 regardless of the logic level of the first and second control signals A and B.

A clock divider including a state machine operating based on transitions of the state value in FIG. 3B will be described with reference to FIG. 4A.

Figure 4A:
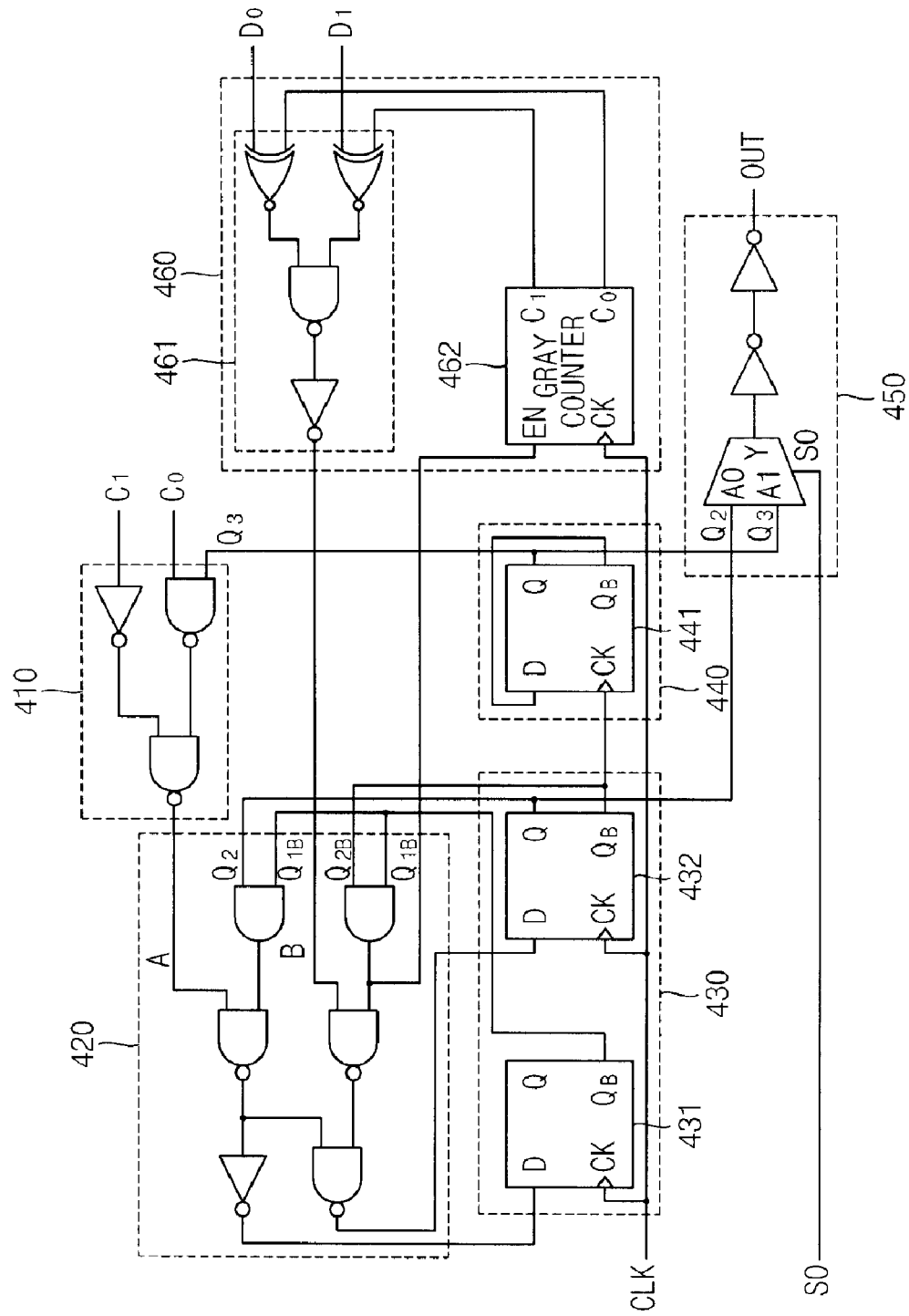
FIG. 4A is a circuit diagram illustrating a clock divider according to an exemplary embodiment of the present invention.

FIG. 4A is a circuit diagram illustrating a clock divider according to an exemplary embodiment of the present invention.

Referring to FIG. 4A, in first and second D flip-flops 431 and 432, input signals may be referred to as D1 and D2, respectively, non-inverting output signals may be referred to as Q1 and Q2, respectively, and inverting output signals may be referred to as Q1B and Q2B. In a third D flip-flop 440, a non-inverting output signal and an inverting output signal may be referred to as Q3 and Q3B, respectively.

A clock divider may include a first state storage unit 430, a second state storage unit 440, a first control signal generating unit 410, a second control signal generating unit 460, a state update unit 420 and an output unit 450.

The first control signal generating unit 410 may generate a first control signal A for determining a state transition path based on a first division ratio control signal C0C1.

The second control signal generating unit 460 may generate a second control signal B for determining a state transition path based on a second division ratio control signal D0D1. The second control signal generating unit 460 may include a counter 462 configured to count in synchronization with a clock when a counting enable signal generated by the state update unit 420 is activated, and a second control signal generating circuit 461 configured to generate a second control signal B based on output signals of the counter 462 and the second division ratio control signal D0D1. In an exemplary embodiment of the present invention, the counter 462 is implemented by a gray counter. The gray counter may reduce the errors that may occur when a clock divider operates at high speed.

The first state storage unit 430 may include the first and second D flip-flops 431 and 432 to store a first state value represented as two-bit data Q1Q2. The first D flip-flop 431 may store Q1 of the first state value Q1Q2, and the second D flip-flop 432 may store Q2 of the first state value Q1Q2. A clock terminal of the first and second D flip-fops 431 and 432 may be provided with a clock CLK.

The state update unit 420 may generate an update signal based on a first state signal determined by the first state value of the first state storage unit 430. The update signal may include a first update signal and a second update signal where the first update signal may be applied to an input terminal of the first D flip-flop 431, and where the second update signal may be applied to an input terminal of the second D flip-flop 432.

The first update signal and the second update signal may be determined by Equation 2.

$$D1(NEXT) = Q1B \cdot Q2 \cdot A$$

$$D2(NEXT) = (Q1B \cdot Q2B \cdot B) + (Q1B \cdot Q2 \cdot A),$$ [Equation 2]

where D1(NEXT) indicates the first update signal and D2(NEXT) indicates the second update signal.

When the first and second D flip-flops 431 and 432 are provided with the update signal the first state value Q1Q2 may transition to the next state value in synchronization with the clock.

The first state signal including the updated output signal Q1B of the first D flip-flop 431 and the updated output signals Q2 and Q2B of the second D flip-flop 432 may be applied to the state update unit 420 to be used to generate the next update signal. The first state signal may be determined by the first state value and include the output signals Q1, Q1B, Q2 and Q2B of the first and second D flip-flops 431 and 432. Similarly, a second state signal may be determined by a second state value and include the output signals Q3 and Q3B of the third D flip-flop 441.

The second state storage unit 440 may include the third D flip-flop 441 to store the second state value. A clock terminal of the third D flip-flop 441 may be provided with the first state signal. In an exemplary embodiment of the present invention, the clock terminal of the third D flip-flop 441 is provided with the inverting output signal Q2B of the second D flip-flop 432. It is to be understood that the clock terminal of the third D flip-flop 441 may be provided with the non-inverting output signal Q2 of the second D flip-flop 432.

The output signal Q3 of the second state storage unit 440 may be alternated between 0 and 1 at a rising edge of the inverting output signal Q2B of the second D flip-flop 432, and the output signal Q3 of the second state storage unit 440 may be alternated between 0 and 1 at a falling edge of the non-inverting output signal Q2 of the second D flip-flop 432. However, it is to be understood that the clock divider may be configured such that the output signal Q3 of the second state storage unit 440 may be alternated between 0 and 1 at a rising edge of the non-inverting output signal Q2 of the second D flip-flop 432. An edge of the non-inverting output signal Q2 of the second D flip-flop 432, which corresponds to a transition time point of the output signal Q3 of the second state storage unit 440, may be referred to as an active edge.

In the third D flip-flop 441, the inverting output terminal may be electrically coupled with an input terminal. Thus, the output signal of the third D flip-flop 441 may be alternated between 0 and 1 in response to a rising edge or a falling edge of the inverting output signal of the second D flip-flop 432.

The output unit 450 may select either the non-inverting output signal Q2 of the second D flip-flop 432, which is included in the first state signal, or the non-inverting output signal Q3 of the third D flip-flop 441, which is included in the second state signal, according to an output control signal S0, to output the selected signal. However, it is to be understood that the output unit may select either the inverting output signal Q2B of the second D flip-flop 432, which is included in the first state signal, or the inverting output signal Q3B of the third D flip-fop 441, which is included in the second state signal, according to the output control signal S0, to output the selected signal.

Figures 4B, 5:
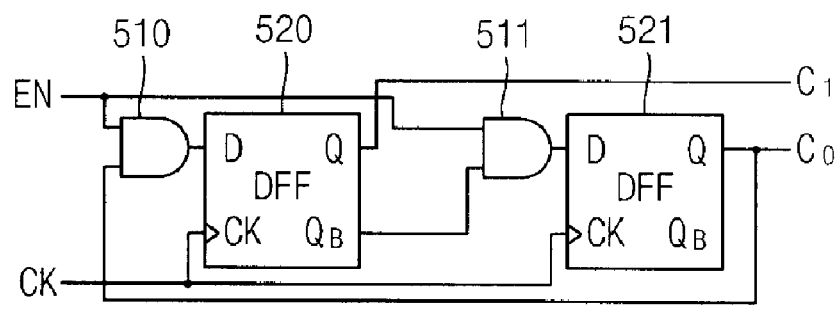
FIG. 4B is a table illustrating a change of a division ratio of the clock divider of FIG. 4A, according to a division ratio control signal.
FIG. 5 is a circuit diagram illustrating a counter according to an exemplary embodiment of the present invention.

FIG. 4B is a table illustrating a change of a division ratio of the clock divider in FIG. 4A, according to a division ratio control signal.

Referring to FIG. 4B, a first division ratio control signal C1C0 may include a first bit C1 and a second bit C0 and a second division ratio control signal D1D0 may include a first bit D1 and a second bit D0.

When the first bit C1 and the second bit C0 correspond to 0 and the output control signal S0 corresponds to 0 a division ratio may be 1/2. When the first bit C1 corresponds to 0, the second bit C0 corresponds to 1 and the output control signal S0 corresponds to 0, the division ratio may be 1/2.5, which is not suitable for a duty ratio of 1/2. When the first bit C1 and the second bit C0 correspond to 1 and the output control signal S0 corresponds to 0, the division ratio may be 1/4.

When the output control signal S0 corresponds to 1, the division ratio may be determined by the second division ratio control signal D1D0.

When the first bit C1 and the first bit C0 correspond to 0 and the output control signal S0 corresponds to 1, the division ratio may be 1/4, 1/6, 1/8 or 1/10 according to the second division ratio control signal D1D0.

When the first bit C1 corresponds to 0, the second bit C0 corresponds to 1 and the output control signal S0 corresponds to 1, the division ratio may be 1/5, 1/7, 1/9 or 1/11 according to the second division ratio control signal D1D0.

When the first bit C1 and the second bit C0 correspond to 1 and the output control signal S0 corresponds to 1 the division ratio may be 1/6, 1/8, 1/10 or 1/12 according to the second division ratio control signal D1D0.

FIG. 5 is a circuit diagram illustrating a counter according to an exemplary embodiment of the present invention.

In an exemplary embodiment of the present invention, a counter is implemented by a gray counter.

A counting enable signal EN may be activated, for example when EN=1, in the case that a state value corresponds to 00, and may not be activated, for example when EN=0 in the case that the state value does not correspond to 00

When the counting enable signal EN is not activated, for example when EN=0, output signals of a first AND gate 510 and a second AND gate 511 may aft be always 0. Thus, both a first signal C1 from a non-inverting output terminal of a first D flip-flop 520 and a second signal C0 from a non-inverting output terminal of a second D flip-flop 521 may maintain 0. The first signal C1 and the second signal C0 may respectively correspond to the first and second bits of the first division ratio control signal C1C0 in FIG. 4A.

A case when the counting enable signal EN is activated, for example when EN=1, will be described below.

The first AND gate 510 is provided with 1 and 0 so that an output signal of the first AND gate 510 may be 0. The second AND gate 511 is provided with 1 and 1 so that an output signal of the second AND gate 511 may be 1. Thus, the first signal C1 may correspond to 0, and the second signal C0 may correspond to 1 at a rising edge of the clock.

When the first signal C1 corresponds to 0 and the second signal C0 corresponds to 1, the output signal of the first AND gate 510 may maintain 0 and the output signal of the second AND gate 511 may transition to 0. Thus, the first signal C1 may correspond to 1 and the second signal C0 may correspond to 1 at a rising edge of the next clock.

When the first signal C1 corresponds to 1 and the second signal C0 corresponds to 1, the output signal of the first AND gate 510 may transition to 1 and the output signal of the second AND gate 511 may maintain 0. Thus, the first signal C1 may correspond to 1 and the second signal C0 may correspond to 0 at a rising edge of the next clock.

When the first signal C1 corresponds to 1 and the second signal C0 corresponds to 0, the output signal of the first AND gate 510 may maintain 1 and the output signal of the second AND gate 511 may transition to 1. Thus, the first signal C1 may correspond to 0 and the second signal C0 may correspond to 0 at a rising edge of the next clock.

In an exemplary embodiment of the present invention, the first division ratio control signal C1C0 reiterates 00, 01, 11 and 10.

The clock dividers may not provide a clock of a duty ratio of 50:50 when a division ratio is 1/(2n+1), where n is a positive integer. Thus, the clock dividers may not be as applied to a phase locked loop (PLL) or a system in which both a rising edge and a falling edge are needed. Hereinafter, a clock divider capable of producing a clock at a duty ratio of 50:50 even in the case that a division ratio is 1/(2n+1), where n is a positive integer, will be described with reference to FIGS. 6A, 6B and 7.

Figure 6A:
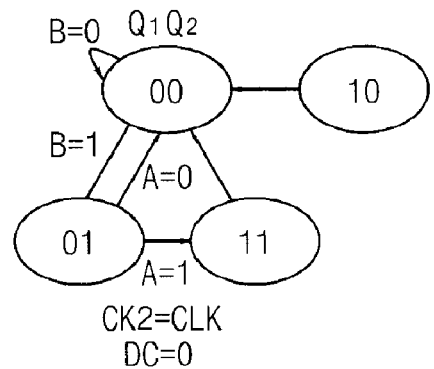
FIG. 6A is a state diagram illustrating operations of a clock divider according to an exemplary embodiment of the present invention.
Figure 6B:
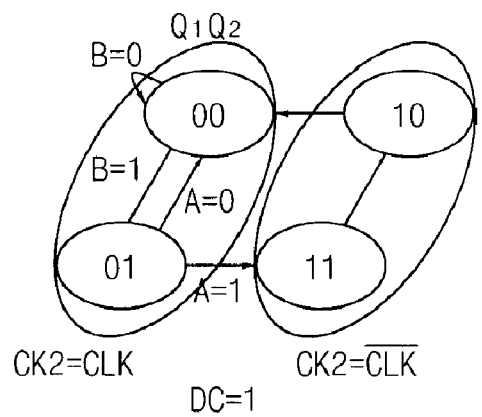
FIG. 6B is a state transition table corresponding to the state diagram of FIG. 6A.

FIG. 6A is a state diagram illustrating operations of a clock divider according to an exemplary embodiment of the present invention. FIG. 6B is a table illustrating a transition of a state value in FIG. 6A.

A clock of a duty ratio of 50:50 may be provided as described below. For example, a clock divider has a duty ratio of 2/5 or 3/5 in the case that a division ratio is 1/5. That is, in case of the duty ratio of 2/5, a clock provided from the clock divider corresponds to 1 during two clock cycles and to 0 during three clock cycles. Similarly, in case of the duty ratio of 3/5, a clock provided from the clock divider corresponds to 0 during two clock cycles and to 1 during three clock cycles. In case of the clock having the duty ratio of 2/5, the duty ratio may become 50:50 by shortening a time to hold 0 as much as a half clock cycle and lengthening a time to hold 1 as much as a half clock. It can be achieved by shifting a phase of the clock by 180 degrees.

Referring to FIG. 6A and FIG. 6B, a state-transition process may be identical to that of the state diagram 300 in FIG. 6B in which a clock control signal DC corresponds to 0.

The state-transition of the state diagram in FIG. 6A, in which the clock control signal DC corresponds to 1, will be described as below.

A state value may be represented as two-bit data Q1Q2 corresponding to 00, 01, 11, or 10.

The state value may transition in synchronization with a clock. For example, the state value may transition in response to a rising edge or a falling edge of the clock with one clock cycle.

A control signal may include a first control signal A and a second control signal B to control a state transition path. A phase of a clock may be shifted according to the clock control signal DC. When the clock control signal DC corresponds to 1 and the state value Q1Q2 corresponds to 11 or 10, the phase of the clock may be shifted by 180 degrees, that is, the clock may be inverted.

When the state value Q1Q2 corresponds to 00, the state value Q1Q2 may maintain 00 or transition to 01 according to the second control signal B. In the case that the second control signal B is not activated, for example when B=0, the state value Q1Q2 may maintain 00 and in the case that the second control signal B is activated, for example when B=1, the state value Q1Q2 may transition to 01 in synchronization with the clock CLK.

When the state value Q1Q2 corresponds to 01, the state value Q1Q2 may transition to 00 or 11 according to the first control signal A. In the case that the first control signal A is not activated, for example when A=0, the state value Q1Q2 may transition to 00 in synchronization with the clock and in the case that the first control signal A is activated, for example when A=1, the state value Q1Q2 may transition to 11 in synchronization with the clock. However, it is to be understood that the state diagram may be configured such that the first control signal A is not activated in case of A=1 and is activated in case of A=0.

When the state value Q1Q2 corresponds to 11, the state value Q1Q2 may transition to 10 in synchronization with the inverted clock.

When the state value Q1Q2 corresponds to 10, the state value Q1Q2 may transition to 00 in synchronization with the inverted clock.

When the state value Q1Q2 corresponds to 00, the clock may be inverted again, that is the clock may be turned back to the non-inverted clock.

FIG. 6B is a table illustrating a transition of a state value in FIG. 6A.

When the present state value Q1Q2 corresponds to 00, the next state value Q1Q2 may be 00 in the case that the second control signal B corresponds to 0 and may be 01 in the case that the second control signal B corresponds to 1.

When the present state value Q1Q2 corresponds to 01 the next state value Q1Q2 may be 00 in the case that the first control signal A corresponds to 0 and may be 11 in the case that the first control signal A corresponds to 1.

When the present state value Q1Q2 corresponds to 11 the next state value Q1Q2 may be DC0 regardless of the first and second control signals A and B. In other words, the next state value Q1Q2 may be 10 in the case that the clock control signal DC corresponds to 1 and may be 00 in the case that the clock control signal DC corresponds to 0.

When the present state value Q1Q2 corresponds to 10, the next state value Q1Q2 may be 00 regardless of the first and second control signals A and B.

Figure 7:
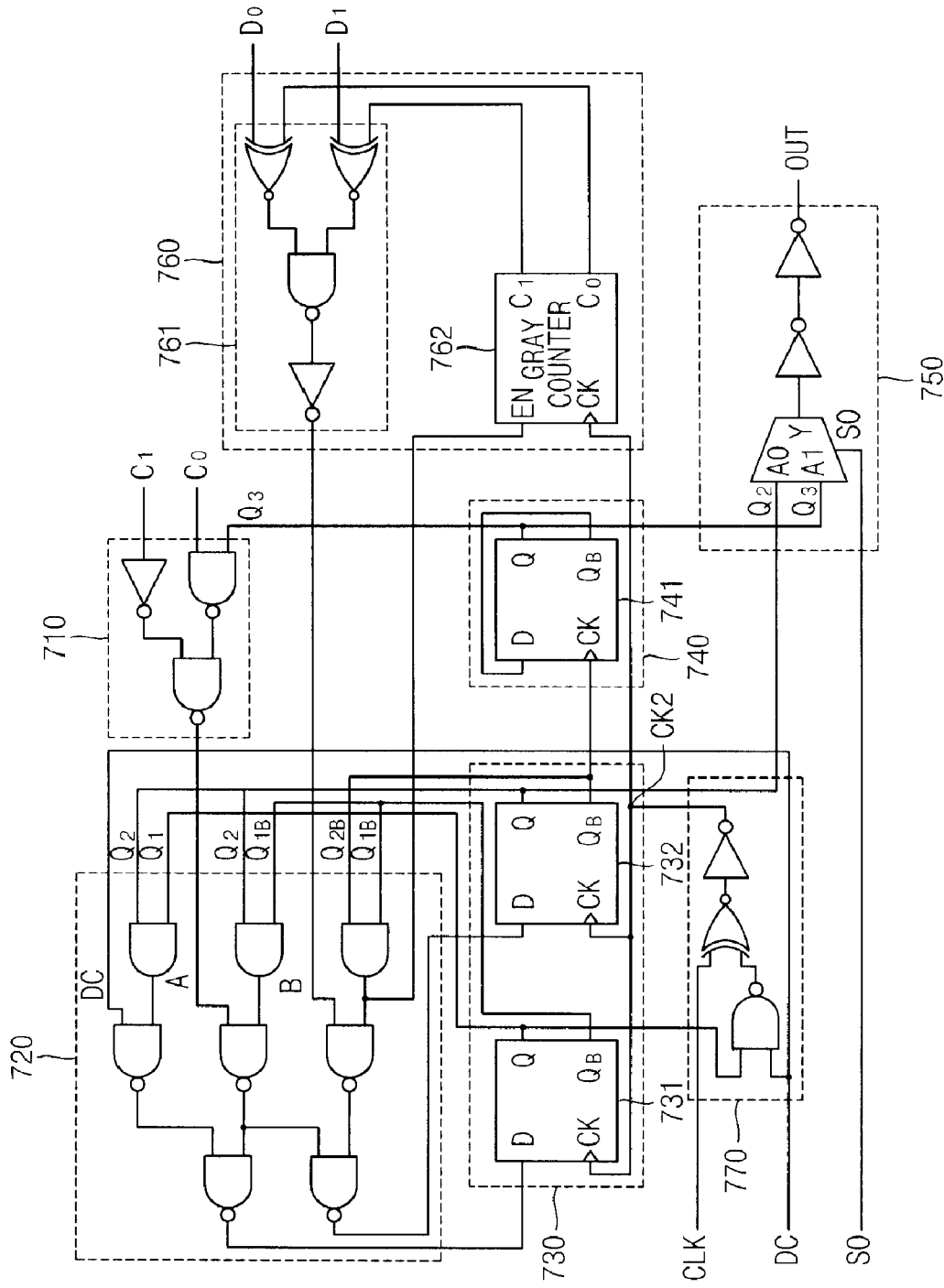
FIG. 7 is a circuit diagram illustrating a clock divider according to an exemplary embodiment of the present invention.

FIG. 7 is a circuit diagram illustrating a clock divider according to an exemplary embodiment of the present invention.

Referring to FIG. 7, in first and second D flip-flops 731 and 732, input signals may be referred to as D1 and D2 respectively, non-inverting output signals may be referred to as Q1 and Q2 respectively and inverting output signals may be referred to as Q1B and Q2B respectively. In addition, in a third D flip-flop 740, a non-inverting output signal and an inverting output signal may be referred to as Q3 and Q3B respectively.

A clock divider may include a first state storage unit 730, a second state storage unit 740, a first control signal generating unit 710, a second control signal generating unit 760, a state update unit 720 and an output unit 750. In addition, the clock divider may include a clock-phase determining unit 770.

The first control signal generating unit 710 may generate a first control signal A for determining a state transition path based on a first division ratio control signal C0C1.

The second control signal generating unit 760 may generate a second control signal B for determining a state transition path value based on a second division ratio control signal D0D1. The second control signal generating unit 760 may include a counter 762 configured to count in synchronization with a clock in the case that a counting enable signal generated by the state update unit 720 is activated, and a second control signal generating circuit 761 configured to generate a second control signal B based on output signals of the counter 762 and the second division ratio control signal D0D1. In an exemplary embodiment of the present invention, the counter 762 is implemented by a gray counter. The gray counter has an advantage of diminishing errors that may occur when a clock divider operates at high speed.

The first state storage unit 730 may include the first and second D flip-flops 731 and 732 to store a first state value represented as two-bit data Q1Q2. The first D flip-flop 731 may store Q1 of the first state value Q1Q2 and the second D flip-flop 732 may store Q2 of the first state value Q1Q2. A clock terminal of the first and second D flip-flops 731 and 732 may be provided with a clock CLK2 from the clock-phase determining unit 770.

The clock-phase determining unit 770 may determine a phase of the clock aft CLK2 based on a clock control signal DC. A phase of the clock CLK2 provided from the clock-phase determining unit 770 may be identical to a phase of the clock CLK in the case that the clock control signal DC corresponds to 0.

When the clock control signal DC corresponds to 1, the phase of the clock CLK2 provided from the clock-phase determining unit 770 may be determined according to the first state value Q1Q2. In the case that the first state value Q12Q corresponds to 11 or 10, the phase of the clock CLK2 may be shifted by 180 degrees compared with a phase of the clock CLK. In other words the clock-phase determining unit 770 may provide the inverted clock CLK2 with respect to the clock CLK applied when the non-inverting output signal Q1 of the first flip-flop 731 corresponds to 1. Likewise, the phase of the clock CLK2 provided from the clock-phase determining unit 770 may be obtained by Equation 3, $$CLK2=(DC \cdot Q1) XOR\ CLK \qquad \text{[Equation 3]}$$

The state update unit 720 may generate an update signal based on a first state signal determined by the first state value of the first state storage unit 730. The update signal may include a first update signal and a second update signal, in which the first update signal may be applied to an input terminal of the first D flip-flop 731 and the second update signal may be applied to an input terminal of the second D flip-flop 732.

The first update signal and the second update signal may be obtained by Equation 2 as shown above, respectively.

When the first and second D flip-flops 731 and 732 is provided with the update signal, the first state value Q1Q2 may transition to the next state value Q1Q2 in synchronization with the clock CLK2.

The first state signal including the updated output signal Q1B of the first D flip-flop 731 and the updated output signals Q2 and Q2B of the second D flip-lop 732 may be applied to the state update unit 720 to be used to generate the next update signal. The first state signal may be determined by the first state value and include the signals Q1, Q1B, Q2 and Q2B of output terminals of the first and second D flip-flops 731 and 732. Similarly, a second state signal may be determined by a second state values and include the signals Q3 and Q3B of output terminals of the third D flip-flop 741.

The second state storage unit 740 may include the third D flip-flop 741 to store the second state value. A clock terminal of the third D flip-flop 741 may be provided with the first state signal. In an exemplary embodiment of the present invention, the clock terminal of the third D flip-flop 741 is provided with the inverting output signal Q2B of the second D flip-flop 732.

The output signal Q3 of the second state storage unit 740 may be alternated between 0 and 1 at a rising edge of the inverting output signal Q2B of the second D flip-flop 732. In other words, the output signal Q3 of the second state storage unit 740 may be alternated between 0 and 1 at a falling edge of the non-inverting output signal Q2 of the second D flip-flop 732. However, it is to be understood that the clock divider may be configured such that the output signal Q3 of the second state storage unit 740 may be alternated between 0 and 1 at a rising edge of the non-inverting output signal Q2 of the second D flip-flop 732. An edge of the non-inverting output signal Q2 of the second D flip-flop 732, which corresponds to a transition time point of the output signal Q3 of the second state storage unit 740, may be referred to as an active edge.

In the third D flip-flop 741, an inverting output terminal may be electrically coupled with an input terminal. Thus, the output signal Q3 of the third D flip-flop 741 may be alternated between 0 and 1 in response to a rising edge or a falling edge of the inverting output signal Q2B of the second D flip-flop 732.

The output unit 750 may select the non-inverting output signal Q2 of the second D flip-flop 732, which is included in the first state signal or the non-inverting output signal Q3 of the third D flip-flop 741 which is included in the second state signal, according to an output control signal S0, to output the selected signal. However, it is to be understood that the output unit may also select the inverting output signal Q2B of the second D flip-flop 732, which is included in the first state signal, or the inverting output signal Q3B of the third D flip-flop 741, which is included in the second state signal, to output the selected signal.

Figure 8:
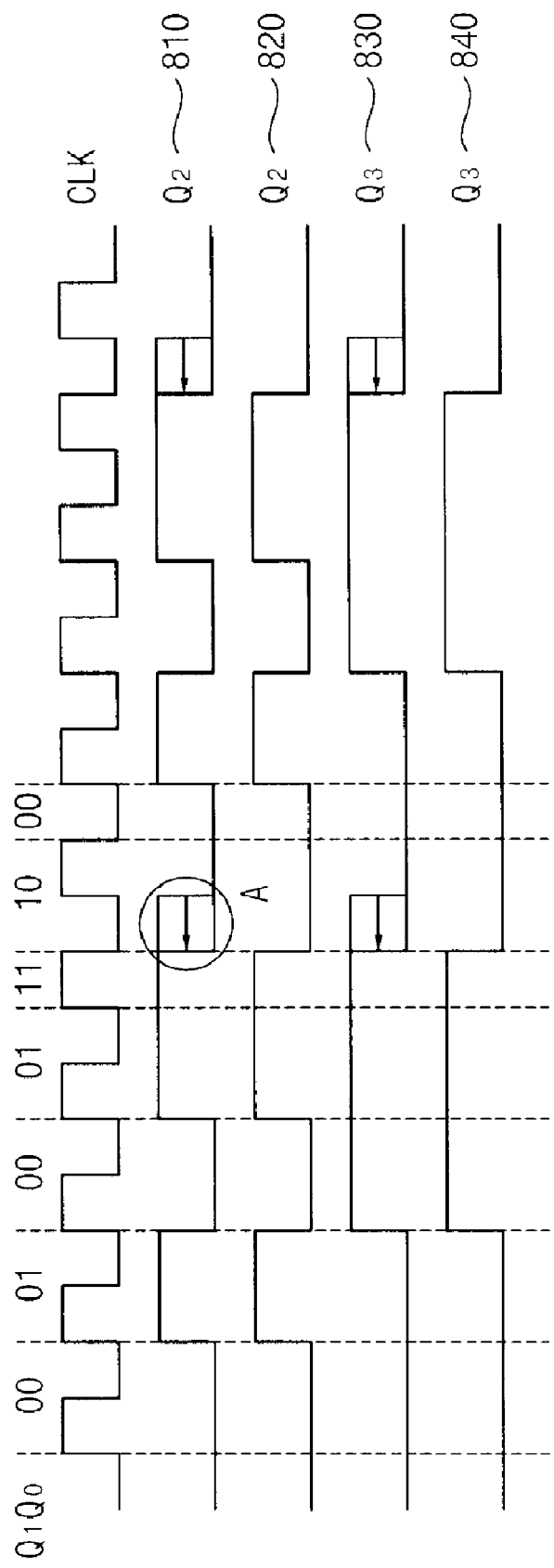
FIG. 8 is a waveform diagram illustrating output signals of the clock divider of FIG. 7, according to a clock control signal.

FIG. 8 is a waveform diagram illustrating output signals of the clock divider in FIG. 7, according to a clock control signal.

A process of changing a duty ratio of a clock divided by five into 50:50 will be described below.

Referring to FIG. 8, in the case that the clock control signal DC corresponds to 0, the first and second output signals of the clock divider may be referred to as Q2 810 and Q3 830, respectively. In the case that the clock control signal DC corresponds to 1, the first and second output signals of the clock divider may be referred to as Q2 820 and Q3 840, respectively.

As shown in FIG. 8, when the state value corresponds to 11, the first output signal Q2 820 may transition to 0 earlier by as much as a half clock than the first output signal Q2 810. The second output signal Q3 840 may be generated by the first output signal Q2 820 so that the second output signal Q3 840 may transition to 0 earlier by as much as a half clock than the second output signal Q3 830.

Thus, the second output signal Q3 840 may have a 1/5 frequency of an original clock and a duty ratio of 50:50.

Generally, a duty ratio of a clock divider having a division ratio of 1/(2n+1) such as 1/7, 1/9 or 1/11, where n is a positive integer, may be adjusted to 50:50.

Figure 9:
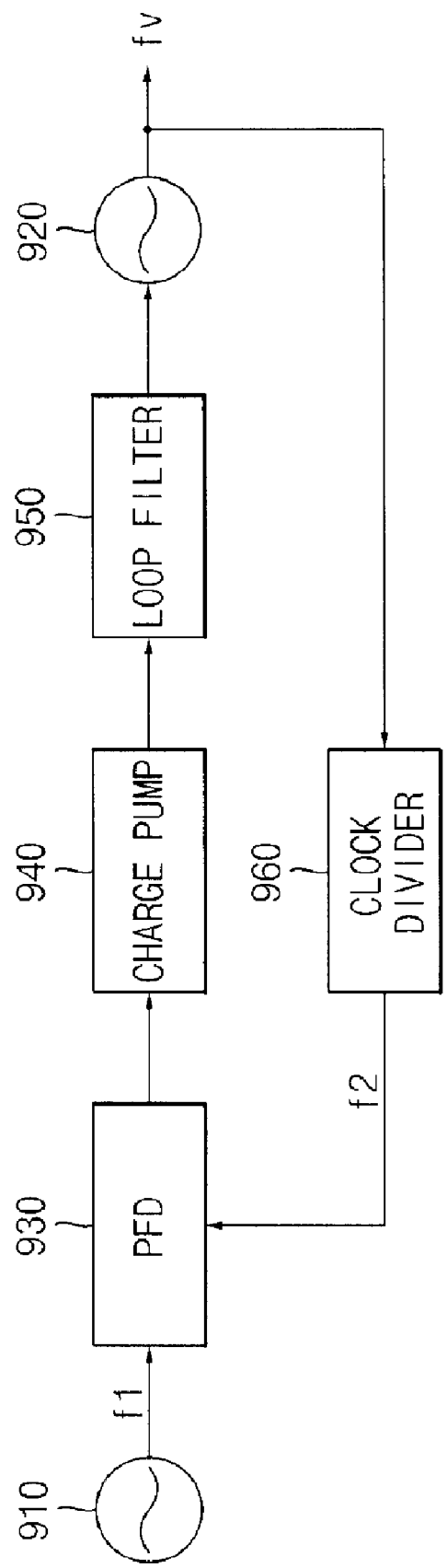
FIG. 9 is a block diagram illustrating a phase locked loop (PLL) including a clock divider according to an exemplary embodiment of the present invention.

FIG. 9 is a block diagram illustrating a phase locked loop PLL including a clock divider according to an exemplary embodiment of the present invention.

Referring to FIG. 9, a phase locked loop PLL may include a reference frequency generator 910, a voltage-controlled oscillator 920, a clock divider 960, a phase/frequency detector 930, a charge pump 940 and a loop filter 950.

The reference frequency generator 910 may generate a reference frequency f1 that is substantially invariable to temperature changes. In an exemplary embodiment of the present invention, the reference frequency generator 910 is implemented by a temperature compensated crystal oscillator TCXO.

The voltage-controlled oscillator 920 may generate an output frequency fv according to a control voltage provided from the loop filter 950. Generally, the voltage-controlled oscillator 920 generates the output frequency fv proportional to the control voltage.

The clock divider 960 may divide the output frequency fv by a predetermined division ratio N to be provided to the phase/frequency detector 930. The clock divider 960 may be implemented by a clock divider having a duty ratio of 50:50, according to an exemplary embodiment of the present invention.

The phase/frequency detector 930 may detect a phase difference of the reference frequency f1 and the divided frequency f2, and a frequency difference of the reference frequency f1 and the divided frequency f2. The phase/frequency detector 930 may generate an up-signal or a down-signal based on the phase difference of the reference frequency f1 and the divided frequency f2, to provide the generated signal to the charge pump 940.

The charge pump 940 may receive the up-signal or the down-signal from the phase/frequency detector 930 and may provide a charge to the loop filter 950 with different levels according to the received signal. The loop filter 950 may receive charges from the charge pump 940 to provide the control voltage to the voltage controlled oscillator 960.

As described above a clock divider according to an exemplary embodiment of the present invention is capable of providing different clocks of various division ratios with a simple structure including a small number of D flip-flops and a counter. A clock divider according to an exemplary embodiment of the present invention may be implemented by small chip size. A clock divider according to an exemplary embodiment of the present invention may be capable of providing different clocks of various division ratios, and a glitch may be prevented without an additional filter.

A clock divider according to an exemplary embodiment of the present invention is capable of providing different clocks having a duty ratio of 50:50 regardless of a division ratio with a simple structure including a small number of D flip-flops and a counter, and the clock divider may be applied in a system using both of a rising edge and a falling edge.

Although exemplary embodiments of the present invention have been described in detail with reference to the accompanying drawings for the purpose of illustration, it is to be understood that the inventive processes and apparatus should not be construed as limited thereby. It will be apparent to those of ordinary skill in the art that various modifications to the foregoing exemplary embodiments can be made without departing from the scope of the invention as defined by the appended claims with equivalents of the claims to be included therein.

What is claimed is:

1. A clock divider comprising:
    a first state storage unit configured to receive an update signal to perform transition of a first state value in synchronization with a clock signal;
    a second state storage unit configured to perform transition of a second state value in synchronization with a first state signal corresponding to the first state value:
    a first control signal generating unit configured to generate a first control signal for determining a state transition path based on a first division ratio control signal;
    a state update unit configured to generate the update signal based on the first control signal and the first state signal; and
    an output unit configured to selectively output one of the first state signal or a second state signal corresponding to the second state value.

2. The clock divider of claim 1, wherein the first state storage unit comprises a plurality of D flip-flops.

3. The clock divider of claim 1, wherein the second state storage unit comprises a D flip-flop.

4. The clock divider of claim 3, wherein the D flip-flop of the second state storage unit comprises an inverting output terminal and an input terminal electrically coupled to each other.

5. The clock divider of claim 1, further comprising a second control signal generating unit configured to generate a second control signal for determining a state transition path based on a second division ratio control signal.

6. The clock divider of claim 5, wherein the state update unit generates the update signal further based on the second control signal.

7. The clock divider of claim 5, wherein the state update unit generates a counting enable signal based on the first state signal, and the second control signal generating unit comprises:
    a counter configured to count in synchronization with the clock signal when the counting enable signal is enabled; and
    a second control signal generating circuit configured to generate the second control signal based on an output signal of the counter and the second division ratio control signal.

8. The clock divider of claim 7, wherein the counter is a gray counter.

9. A clock divider comprising:
    a clock-phase determining unit configured to determine a phase of a clock signal based on a clock control signal;

a first state storage unit configured to receive an update signal to perform transition of a first state value in synchronization with the clock signal;

a second state storage unit configured to perform transition of a second state value in synchronization with a first state signal corresponding to the first state value;

a control signal generating unit configured to generate a control signal for determining a state transition path based on a division ratio control signal;

a state update unit configured to generate the update signal based on the control signal the first state signal and the clock control signal; and an output unit configured to selectively output one of the first state signal or a second state signal corresponding to the second state value, an output signal of the output unit having a duty ratio of 50:50.

10. The clock divider of claim 9, wherein the first state storage unit comprises a plurality of D flip-flops.

11. The clock divider of claim 9, wherein the second state storage unit comprises a D flip-flop.

12. The clock divider of claim 11, wherein the D flip-flop of the second state storage unit comprises an inverting output terminal and an input terminal electrically coupled to each other.

13. The clock divider of claim 9, wherein the state update unit generates a counting enable signal based on the first state signal and the control signal generating unit comprises, a counter configured to count in synchronization with the clock signal when the counting enable signal is enable; and a control signal generating circuit configured to generate the control signal based on an output signal of the counter and the division ratio control signal.

14. The clock divider of claim 13, wherein the counter is a gray counter.

15. A clock divider comprising:

a clock-phase determining unit configured to determine a phase of a clock signal based on a clock control signal;

first and second D flip-flops configured to receive the clock signal through clock terminals respectively;

a third D flip-flop configured to receive an output signal of the second D flip-flop through a clock terminal, an inverting output terminal and an input terminal of the third D flip-flop being electrically coupled to each other;

a control signal generating unit configured to generate a control signal for determining a state transition path based on a division ratio control signal;

a state update unit configured to generate first and second update signals based on the control signal and output signals of the first and second D flip-flops, configured to provide the first update signal to an input terminal of the first D flip-flop, and configured to provide the second update signal to the input terminal of the second D flip-flop; and an output unit configured to selectively output one of an output signal of the second D flip-flop or an output signal of the third D flip-flops, an output signal of the output unit having a duty ratio of 50:50.

16. The clock divider of claim 15, wherein the clock-phase determining unit determines a phase of the clock signal based on the clock control signal and an output signal of the first D flip-flop.

17. The clock divider of claim 15, wherein the state update unit generates a counting enable signal based on the output signals of the first and second D flip-flops, and the control signal generating unit comprises:

a counter configured to count in synchronization with the clock signal when the counting enable signal is enable; and a control signal generating circuit configured to generate the control signal based on an output signal of the counter and the division ratio control signal.

18. The clock divider of claim 17, wherein the counter is a gray counter.

19. A clock divider comprising:

a clock-phase determining unit configured to determine a phase of a clock signal based on a clock control signal;

a state machine configured to store a state value transitioning in synchronization with the clock signal and configured to provide a first output signal corresponding to the state value;

a control signal generating unit configured to provide a first control signal and a second control signal for controlling a transition path of the state value;

a second output signal generating unit configured to generate a second output signal reiterating a rising and a falling in synchronization with an active edge of the first output signal; and an output unit configured to selectively output one of the first output signal or the second output signal based on an output control signal.

20. The clock divider of claim 19, wherein the state value corresponding to 00 maintains 00 when the second control signal is not activated and transitions to 01 in synchronization with a non-inverting clock signal when the second control signal is activated, the state value corresponding to 01 transitions to 00 in synchronization with the non-inverting clock signal when the first control signal is not activated and transitions to 11 in synchronization with the non-inverting clock signal when the first control signal is activated, and the state value corresponding to one of 11 or 10 transitions to 00 in synchronization with the non-inverting clock signal, and wherein the output unit provides the first output signal.

21. The clock divider of claim 20, wherein the control signal generating unit comprises a counter configured to count a number of clocks while the second control signal is not activated.

22. The clock divider of claim 19, wherein the state value corresponding to 00 maintains 00 when the second control signal is not activated and transitions to 01 in synchronization with a non-inverting clock signal when the second control signal is activated, the state value corresponding to 01 transitions to 00 in synchronization with the non-inverting clock signal when the first control signal is not activated and transitions to 11 in synchronization with the non-inverting clock signal when the first control signal is activated, the state value corresponding to 11 transitions to 10 in synchronization with the non-inverting clock signal, and the state value corresponding to 10 transitions to 0 in synchronization with the non-inverting clock signal, and wherein the output unit provides the first output signal.

23. The clock divider of claim 22, wherein the control signal unit comprises a counter configured to count a number of clocks while control signal is not activated when the state value corresponds to 00.

* * * * *